US008625647B2

(12) United States Patent
Ohira et al.

(10) Patent No.: US 8,625,647 B2
(45) Date of Patent: Jan. 7, 2014

(54) SEMICONDUCTOR LASER

(71) Applicants: Kazuya Ohira, Tokyo (JP); Nobuo Suzuki, Kanagawa (JP)

(72) Inventors: Kazuya Ohira, Tokyo (JP); Nobuo Suzuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/677,951

(22) Filed: Nov. 15, 2012

(65) Prior Publication Data
US 2013/0259078 A1  Oct. 3, 2013

(30) Foreign Application Priority Data

Mar. 29, 2012  (JP) .................................. 2012-077743

(51) Int. Cl.
*H01S 5/00* (2006.01)
(52) U.S. Cl.
USPC .................. 372/43.01; 372/45.01; 372/46.01; 372/64
(58) Field of Classification Search
USPC ................................. 372/43.01, 45.01, 46.01
See application file for complete search history.

(56) References Cited

U.S. PATENT DOCUMENTS

| 2005/0238075 | A1* | 10/2005 | Jikutani et al. | 372/45.012 |
| 2007/0153856 | A1* | 7/2007 | Kageyama et al. | 372/45.012 |
| 2012/0069862 | A1* | 3/2012 | Ohira et al. | 372/45.01 |
| 2012/0250714 | A1 | 10/2012 | Ohira et al. | |

OTHER PUBLICATIONS

Thijs Spuesens, et al., "Improved design of an InP-based microdisk laser heterogeneously integrated with SOI", IEEE International conference on group IV Photonics, 2009, 3 pages, FA3.
A. Kapsalis, et al., "7Gb/s Direct Modulation of Vertically Coupled Microring Lasers", Conference on Optical Fiber communication / National Fiber Optic Engineers Conference, 2008, 3 pages, OFC/ NFOEC 2008, OWQ4.

* cited by examiner

*Primary Examiner* — Dung Nguyen
(74) *Attorney, Agent, or Firm* — Oblon, Spivak, McClelland, Maier & Neustadt, L.L.P.

(57) ABSTRACT

A semiconductor laser of an embodiment includes: an optical resonator having a first cladding layer, a ring-shaped active layer on the first cladding layer, a ring-shaped second cladding layer on the active layer, a first electrode inside the ring shape on the first cladding layer, a ring-shaped second electrode on the second cladding layer, a first insulating layer between the first cladding layer and the active layer, formed from an inside wall toward an outside wall of the ring shape, where an outside wall side edge thereof is on an inner side than the outside wall, and a second insulating layer between the active layer and the second cladding layer, formed from the inside wall toward the outside wall, where an outside wall side edge thereof is on an inner side than the outside wall; and an optical waveguide optically coupled to the optical resonator.

10 Claims, 2 Drawing Sheets

SEMICONDUCTOR LASER

CROSS-REFERENCE TO RELATED APPLICATION

This application is based upon and claims the benefit of priority from Japanese Patent Application No. 2012-077743, filed on Mar. 29, 2012, the entire contents of which are incorporated herein by reference.

FIELD

Embodiments described herein relate generally to a semiconductor laser.

BACKGROUND

In recent years, the internal circuit pattern has become finer with an increase in the packing density of an LSI. As the pattern becomes finer, wiring resistance increases due to a decrease in the cross-sectional area of a wiring and the capacity between wirings increases since a space between adjacent wirings becomes narrow.

As a result, wiring delay time to be dermined by wiring resistance and wiring capacity increases, and a further increase in the speed of an LSI becomes difficult. Moreover, with the advancement of the multi-core technology of the inside of an LSI and the three-dimensional integration technology of memory, the large-capacity signal transmission between cores and between a core and memory are necessary, and the signal transmission speed by electricity is a bottleneck of an increase in the performance of an LSI.

As a technology for solving such a problem of wiring delay incident to an increase in the packing density of an LSI, an optical interconnect technology that replaces an electrical signal with an optical signal is being focused. The optical interconnect technology is a system that transmits a signal by using an optical waveguide instead of a metal interconnect, and there is no increase in wiring resistance and capacity between wirings caused by the finer pattern similar to the above, and it is possible to expect a further increase in the speed of operation.

In the optical interconnect technology, with regard to a semiconductor laser used as a light source, the size of the device used in known optical communication is several μm in width and 100 μm in length, and is very large compared with a transistor and a wiring pitch of an LSI. Therefore, it becomes a big inhibiting factor against replacing electric interconnects with optical interconnects.

Hence, a micro-ring laser using a micro-ring resonator as a small-sized light source has been devised. An optical device needs to be integrated in an LSI for optical signal transmission between LSI chips, and small, simple and low-power semiconductor laser is being required, and a micro-ring laser is a very potent device. A micro-ring laser whose oscillation mode is so stable as to be capable of direct modulation has, in fact, not been realized.

DETAILED DESCRIPTION

Figure 1A:
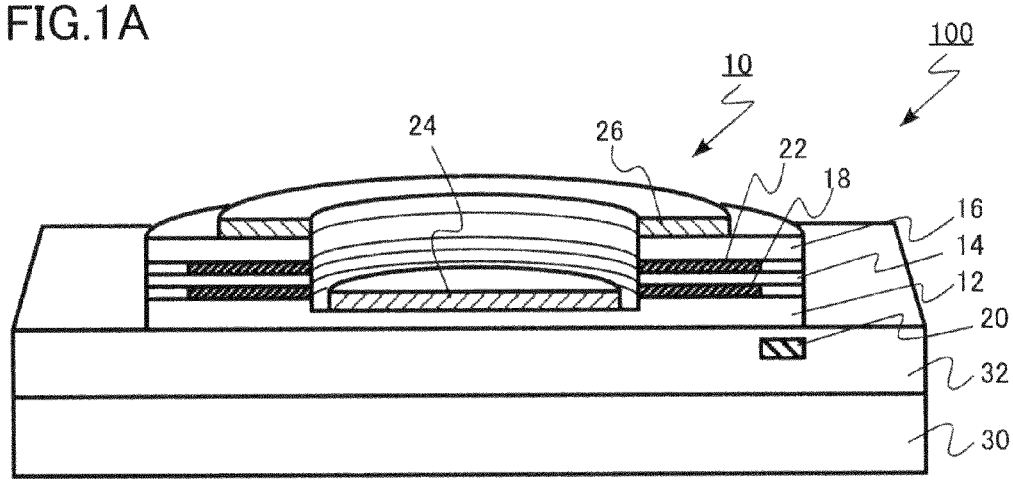
FIGS. 1A and 1B are schematic drawings of a semiconductor laser of an embodiment.

A semiconductor laser of an embodiment includes: an optical resonator having a first cladding layer, a ring-shaped active layer formed on the first cladding layer, a ring-shaped second cladding layer formed on the active layer, a first electrode formed inside the ring shape on the first cladding layer, a ring-shaped second electrode formed on the second cladding layer, a first insulating layer formed between the first cladding layer and the active layer and formed from an inside wall toward an outside wall of the ring shape, where an edge thereof on the outside wall side is on an inner side than the outside wall of the ring shape, and a second insulating layer formed between the active layer and the second cladding layer and formed from the inside wall toward the outside wall of the ring shape, where an edge thereof on the outside wall side is on an inner side than the outside wall of the ring shape; and an optical waveguide optically coupled to the optical resonator.

A description will hereinafter be given of a semiconductor laser of an embodiment with reference to drawings.

In the specification, the ring shape is not limited to a shape whose outer circumference and inner circumference are circles, and is a concept including all shapes as long as the shape is a closed shape as a ring, such as an elliptic shape and a shape combining a straight line and a curved line.

A semiconductor laser of the embodiment includes an optical resonator having: a first cladding layer; a ring-shaped active layer formed on the first cladding layer; a ring-shaped second cladding layer formed on the active layer; a first electrode formed inside the ring shape on the first cladding layer; a ring-shaped second electrode formed on the second cladding layer; a first insulating layer formed between the first cladding layer and the active layer and formed from an inside wall toward an outside wall of the ring shape, where an edge thereof on the outside wall side is on an inner side than the outside wall of the ring shape; and a second insulating layer formed between the active layer and the second cladding layer and formed from the inside wall toward the outside wall of the ring shape, where an edge thereof on the outside wall side is on an inner side than the outside wall of the ring shape. Moreover, an optical waveguide optically coupled to the optical resonator is included.

In the semiconductor laser of the embodiment, parts of the top and bottom of the active layer are sandwiched between the first and second insulating layer. With this configuration, the distribution of the current flowing between the first and second electrodes is confined in the vicinity of the outside wall of the ring shape where light circulates. With this current confinement structure, it becomes possible to stabilize the oscillation mode of a laser.

Moreover, the first and second electrodes secure large contact areas on upper surfaces of the first cladding layer inside the ring shape and the ring-shaped second cladding layer, respectively. Accordingly, it is possible to achieve a decrease in contact resistance and suppress the loss and the RC delay.

Hence, it becomes possible to provide a semiconductor laser whose oscillation mode is stable and which is optimal to direct modulation.

Figure 1B:
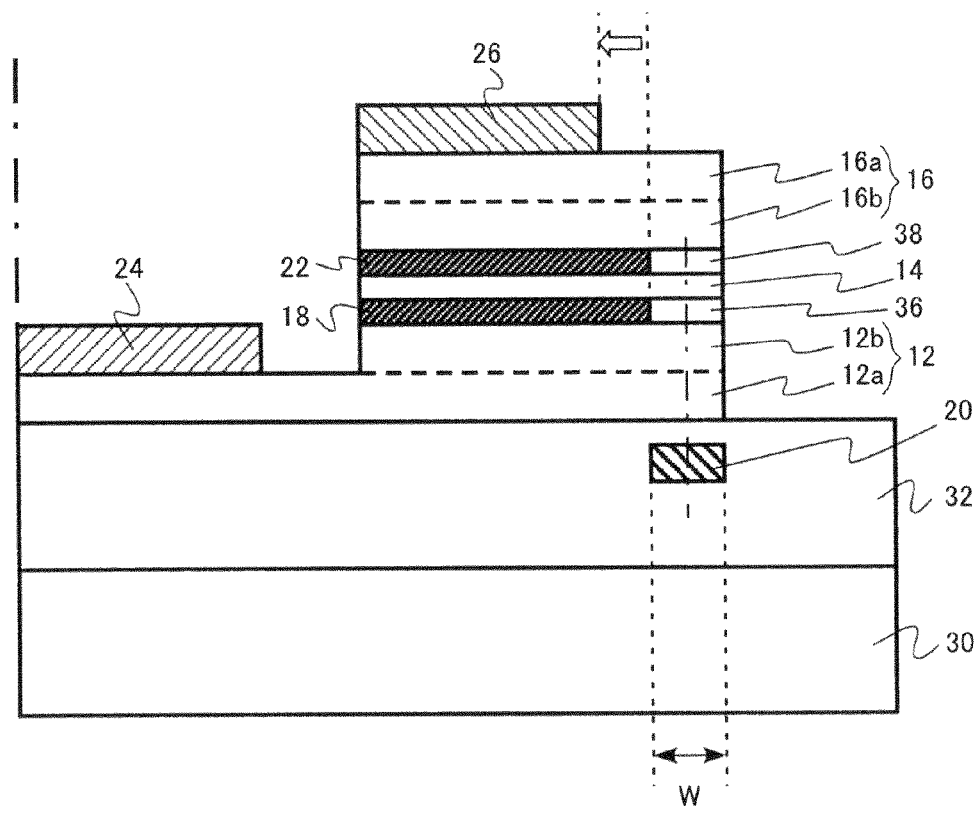

FIGS. 1A and 1B are schematic drawings of the semiconductor laser of the embodiment. FIG. 1A is a perspective cross-sectional view, and FIG. 1B is an enlarged cross-sectional view of the main parts. A semiconductor laser 100 of the embodiment is a micro-ring laser using a micro-ring resonator. The semiconductor laser 100 is a semiconductor laser of a direct modulation type that inputs an electrical signal directly between electrodes of an optical resonator, and modulates the intensity of a laser beam transmitted through a waveguide.

The semiconductor laser 100 of the embodiment includes an optical resonator 10 formed of a plurality of laminated semiconductor layers and an optical waveguide 20 optically coupled to the optical resonator 10. The optical waveguide 20 is formed in an insulating layer (third insulating layer) 32 provided on a semiconductor substrate 30. The optical resonator 10 is provided above the optical waveguide 20 via the insulating layer 32.

The semiconductor substrate 30 is, for example, silicon. The insulating layer 32 is, for example, a silicon oxide film.

The optical waveguide 20 propagates an optical signal generated in the optical resonator 10. For example, the optical waveguide 20 is a wiring formed of amorphous silicon. In FIGS. 1A and 1B, the optical waveguide 20 extends in the direction perpendicular to a paper surface. The optical waveguide 20 is, for example, approximately 0.3 μm to 2 μm in width and approximately 0.2 μm to 2 μm in height.

The semiconductor layers constituting the optical resonator 10 are formed, for example, of compound semiconductors, and are, for example, of a GaAs semiconductor.

The optical resonator includes a first cladding layer 12 whose lower part is a disc shape, a ring-shaped active layer 14 formed on the first cladding layer 12, and a ring-shaped second cladding layer 16 formed on the active layer 14.

The first cladding layer 12 is a disc shape. The first cladding layer 12 includes a contact unit 12a with a high impurity density and low resistance and a cladding unit 12b with a low impurity density and low resistance. Moreover, the second cladding layer 16 includes a contact unit 16a with a high impurity density and low resistance and a cladding unit 16b with a low impurity density and low resistance.

Moreover, included is a first insulating layer 18 formed between the first cladding layer 12 and the active layer 14. The first insulating layer 18 is formed from an inside wall toward an outside wall of the ring shape, and an edge thereof on the outside wall side is on an inner side than the outside wall of the ring shape.

Moreover, included is a second insulating layer 22 formed between the active layer 14 and the second cladding layer 16. The second insulating layer 22 is formed from the inside wall toward the outside wall of the ring shape, and an edge thereof on the outside wall side is on an inner side than the outside wall of the ring shape.

A first electrode 24 is formed on the first cladding layer 12. The first electrode 24 is formed inside the ring shape of the optical resonator 10. The first electrode 24 is formed inside the ring-shaped active layer 14 and second cladding layer 16. For example, an unillustrated insulating layer and a via electrode (not shown) that penetrates the insulating layer and is connected to the top of the first electrode 24 are formed on the first electrode 24.

A second electrode 26 is formed on the second cladding layer 16. The second electrode 26 is a ring shape.

The ring shape of the optical resonator 10 is, for example, approximately 5 to 30 μm in the outer diameter of the ring, approximately 2 to 20 μm in the inner diameter, and approximately 0.5 to 4 μm in thickness.

The first cladding layer 12 is an n-type GaAs layer with a thickness of approximately 50 to 2000 nm, for example. The contact unit 12a is a low resistance layer having a high density of n-type impurities to reduce contact resistance to the first electrode 24. Moreover, the cladding unit 12b has the function of confining light generated in the active layer 14.

The active layer 14 is a layer that generates light and is formed, for example, of an undoped multiple quantum well (Multiple Quantum Well). For example, the active layer 14 has a structure where an InGaAs quantum well layer with a thickness of approximately 8 nm and a GaAs barrier layer with a thickness of approximately 10 nm are alternatively laminated to form three layers, and its top and bottom are sandwiched between $Al_{0.1}Ga_{0.9}As$ layers with a thickness of approximately 40 nm.

The second cladding layer 16 is, for example, a p-type GaAs layer with a thickness of approximately 50 to 2000 nm. The contact unit 16a is a low resistance layer having a high density of p-type impurities to reduce contact resistance to the second electrode 26. Moreover, the cladding unit 16b has the function of confining light generated in the active layer 14.

The first insulating layer 18 has the function of confining the current flowing between the first electrode 24 and the second electrode 26. For example, if the first cladding layer 12 is $Al_{1-X}Ga_XAs$ (0≤X≤1), the first insulating layer 18 is an oxide of $Al_{1-Y}Ga_YAs$ (0≤Y≤1) with a higher density of aluminum (Al) than that of the first cladding layer 12. For example, the first insulating layer 18 is an oxide of an n-type $Al_{0.92}Ga_{0.08}As$ layer with a thickness of approximately 30 to 200 nm.

The first insulating layer 18 is provided, for example, between the first cladding layer 12 and the active layer 14, and is formed by selectively oxidizing, by thermal oxidation, the n-type $Al_{0.92}Ga_{0.08}As$ layer with a higher oxidation speed than the first cladding layer 12 and the active layer 14, which have a low Al density. The $Al_{0.92}Ga_{0.08}As$ layer that has not been oxidized remains as a confinement unit 36 made of semiconductor on the outside wall side of the ring shape.

Similarly, the second insulating layer 22 has the function of confining the current flowing between the first electrode 24 and the second electrode 26. For example, if the second cladding layer 16 is $Al_{1-X}Ga_XAs$ (0≤X≤1), the second insulating layer 22 is an oxide of $Al_{1-Y}Ga_YAs$ (0≤Y≤1) with a higher density of aluminum (Al) than the second cladding layer 16. For example, the second insulating layer 22 is an oxide of a p-type $Al_{0.92}Ga_{0.08}As$ layer with a thickness of approximately 30 to 200 nm.

The second insulating layer 22 is provided, for example, between the active layer 14 and the second cladding layer 16, and is formed by selectively oxidizing, by thermal oxidation, the p-type $Al_{0.92}Ga_{0.08}As$ layer with a higher oxidation speed than the active layer 14 and the second cladding layer 16, which have a low Al density. The $Al_{0.92}Ga_{0.08}As$ layer that has not been oxidized remains as a confinement unit 38 made of semiconductor on the outside wall side of the ring shape.

The first electrode 24 is, for example, an AnZn alloy. The first electrode is an anode. Moreover, the second electrode 26 is, for example, an AuGe alloy. The second electrode is a cathode.

If power is applied between the first electrode 24 and the second electrode 26, carriers are injected into the active layer 14. Stimulated emission occurs due to the recombination of the injected carriers. The light generated by stimulated emission repeats total reflection at an interface on the outside wall side (outer circumference side) of the ring, and circulates in the ring-shaped optical resonator 10 to oscillate a laser beam.

The light obtained by laser oscillation propagates as a signal to the optical waveguide 20 optically coupled to the optical resonator 10.

Figure 2:
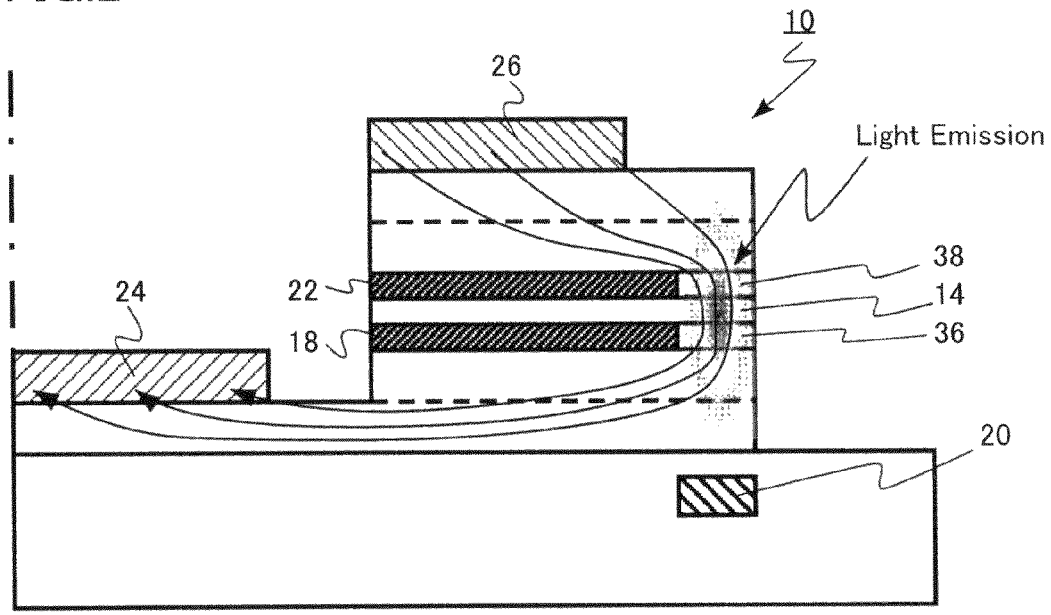
FIG. 2 is a schematic drawing for explaining the operation of the semiconductor laser of the embodiment.

FIG. 2 is a schematic drawing for explaining the operation of the semiconductor laser of the embodiment. The current flowing between the first electrode 24 and the second electrode 26 is confined by the confinement units 36 and 38 since the first and second insulating layers 18 and 22 exist.

Even if the confinement units 36 and 38 are not provided in the ring-shaped micro-ring laser, the light circulating along the outside wall of the ring shape becomes a basic mode being a main mode. The confinement units 36 and 38 confine the current flowing between the first and second electrodes (the arrows in solid lines in the drawing) in the vicinity of the outside wall of the ring shape where light mainly circulates to make it possible to stabilize the oscillation mode of the laser.

Supposing that the confinement units 36 and 38 are not provided, current flows widely in the active layer 14 and a higher order mode of the circulation in various paths occurs other than the basic mode of the circulation along the outside wall of the ring shape. Accordingly, the intensity of light emission becomes unstable easily with respect to the voltage applied between the first and second electrodes. Therefore, in the case of direct modulation where a signal is applied using its intensity as the intensity of the voltage to be applied between the first and second electrodes to modulate the intensity of light emission, a problem that the oscillation mode becomes unstable arises.

As described above, according to the semiconductor laser 100 of the embodiment, the oscillation mode of the laser is stabilized; accordingly, a response of the intensity of light emission with respect to applied voltage is stabilized. Therefore, a semiconductor laser optimal to direct modulation is realized.

Moreover, according to the embodiment, the first electrode 24 and the second electrode 26 can secure a large contact area on the upper surfaces of the first cladding layer 12 inside the ring shape and the ring-shaped second cladding layer 16, respectively. Accordingly, it is possible to achieve a decrease in contact resistance, and the loss and the RC delay are suppressed. Hence, also from this point of view, a semiconductor laser optimal to direct modulation is realized.

Figure 3:
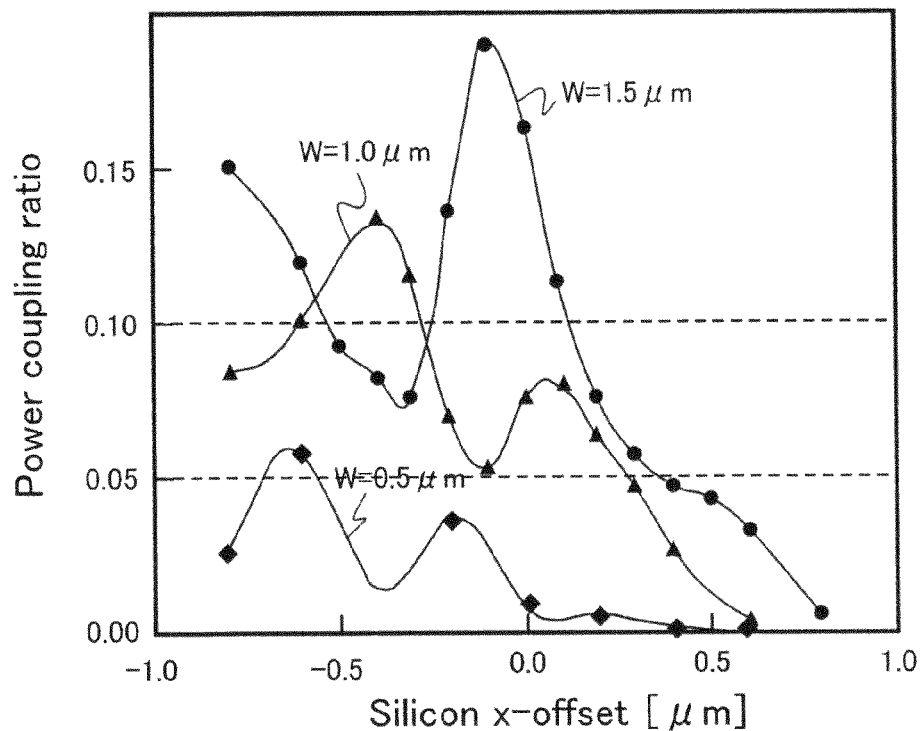
FIG. 3 is a view illustrating the relationship between the displacements and the optical coupling of an optical waveguide of the semiconductor laser of the embodiment.

FIG. 3 is a view illustrating the relationship between the displacements and the optical coupling of an optical waveguide of the semiconductor laser of the embodiment. The horizontal axis indicates the displacements of the optical waveguide 20 relative to the confinement units 36 and 38 in a lateral direction. The origin point is a point where the center positions of the confinement units 36 and 38 agree with the center of the optical waveguide 20. The normal direction is a direction where the optical waveguide 20 is displaced to the outer circumference direction of the ring shape. Moreover, a width W of the optical waveguide 20 is calculated with a range of 0.5, 1.0, and 1.5 μm.

The vertical axis indicates the power coupling ratio to be an index of the amount of light leak from the optical resonator 10 to the optical waveguide 20. If the power coupling ratio is too large, the oscillation does not occur; if too small, the intensity of light propagating through the optical waveguide 20 is lacking. Therefore, the power coupling ratio is desired to be approximately 0.05 to 0.10.

As the optical resonator 10, calculations were made assuming that the outside diameter is 16 μm, the inside diameter 10 μm, the thickness of the semiconductor layer approximately 0.85 μm, and the width of the confinement unit 0.5 μm. Moreover, the insulating layer 32 between the optical resonator 10 and the optical waveguide 20 is assumed to be a silicon oxide film with a thickness of 0.1 μm. The optical waveguide 20 is assumed to be amorphous silicon.

As is clear from FIG. 3, according to the semiconductor laser 10 of the embodiment, a desired power coupling ratio is achieved by appropriately selecting the width and position of the optical waveguide 20.

As indicated by the white arrow of FIG. 1B, it is desired that an edge on an outer circumference side of the second electrode 26 should be on an inner side of the ring shape than the edges on the outside wall sides of the first and second insulating layers 18 and 22 or in a position that agrees with the edges on the outside wall sides of the first and second insulating layers 18 and 22. The second electrode 26 is not placed immediately above the confinement units 36 and 38; accordingly, it becomes possible to suppress the absorption of light by a metal forming the second electrode 26 and reduce the loss.

Moreover, it is desired that the distance between the outside wall of the ring shape and the edges on the outside wall sides of the first and second insulating layers 18 and 22 should be equal to or less than 0.5 μm. In other words, it is desired that the widths of the confinement units 36 and 38 should be equal to or less than 0.5 μm. As long as within this range, it is possible to suppress the occurrence of a higher order mode, and becomes possible to excite the basic mode efficiently; accordingly, the oscillation mode is stabilized.

The distance between the outside wall of the ring shape and the edges on the outside wall sides of the first and second insulating layers 18 and 22 can be measured, for example, by the TEM (Transmission Electron Microscope) observation.

Moreover, with regard to the active layer 14, it is possible to apply a GaInNA multiple quantum well layer on a GaAs substrate, a AlGaInAs multiple quantum well layer on a InP substrate, a AlGaAsSb multiple quantum well layer on a GaSb substrate, a InGaN multiple quantum well layer on a GaN substrate, and the like.

Moreover, the description has been given, taking the N-up structure where the first electrode 24 is a negative electrode (anode) and the second electrode 26 is a positive electrode (cathode) as an example; however, it is possible to take a P-up structure where the first electrode 24 is a positive electrode (cathode) and the second electrode 26 is a negative electrode (anode).

Moreover, the semiconductor laser of the embodiment can be used for, not limited to direct modulation but also other applications.

The description has been given above of the embodiment of the disclosure while referencing the specific example. The above embodiment is cited by way of example only, and does not limit the disclosure. Moreover, in the description of the embodiment, the description of parts that are not directly required for the description of the disclosure of the semiconductor laser and the like is omitted; however, it is possible to appropriately select and use a required element related to a semiconductor laser and the like.

In addition, the scope of the disclosure includes all semiconductor lasers that include the elements of the disclosure and that those skilled in the art can change its design appropriately. The scope of the disclosure is defined by the scope of claims and the scope of equivalents thereof.

While certain embodiments have been described, these embodiments have been presented by way of example only, and are not intended to limit the scope of the inventions. Indeed, a semiconductor laser described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor laser comprising:
an optical resonator of a ring shape including
a first cladding layer,
a ring-shaped active layer formed on the first cladding layer,
a ring-shaped second cladding layer formed on the active layer,
a first electrode formed inside the ring-shaped active layer and second cladding layer on the first cladding layer,
a ring-shaped second electrode formed on the second cladding layer,
a first insulating layer formed between the first cladding layer and the active layer, formed from an inside wall toward an outside wall of the ring shape of the optical resonator, where an edge thereof on the outside wall side is more inward than the outside wall of the ring shape, and
a second insulating layer formed between the active layer and the second cladding layer, formed from the inside wall toward the outside wall of the ring shape of the optical resonator, where an edge thereof on the outside wall side is more inward than the outside wall of the ring shape; and
an optical waveguide optically coupled to the optical resonator.

2. The semiconductor laser according to claim 1, wherein an edge on an outer circumference side of the second electrode is more inward of the ring shape of the optical resonator than the edges on the outside wall sides of the first and second insulating layers, or in a position that agrees with the edges on the outside wall sides of the first and second insulating layers.

3. The semiconductor laser according to claim 1, wherein the first and second cladding layers are $Al_{1-X}Ga_XAs$ ($0 \leq X \leq 1$), and
the first and second insulating layers are oxides of $Al_{1-Y}Ga_YAs$ ($0 \leq Y \leq 1$) having a higher Al density than the cladding layers.

4. The semiconductor laser according to claim 1, wherein a distance between the outside wall of the ring shape of the optical resonator and the edges on the outside wall sides of the first and second insulating layers is equal to or less than 0.5 µm.

5. The semiconductor laser according to claim 1, wherein the first cladding layer is a disc shape.

6. The semiconductor laser according to claim 1, wherein the active layer comprises an undoped multiple quantum well layer.

7. The semiconductor laser according to claim 1, wherein the optical waveguide comprises amorphous silicon.

8. The semiconductor laser according to claim 1, further comprising:
a semiconductor substrate; and
a third insulating layer formed on the semiconductor substrate, wherein
the optical resonator is formed on the third insulating layer, and
the optical waveguide is formed in the third insulating layer.

9. The semiconductor laser according to claim 8, wherein the semiconductor substrate is silicon, and
the insulating layer is a silicon oxide film.

10. The semiconductor laser according to claim 9, wherein the optical waveguide comprises amorphous silicon.

* * * * *